(12) United States Patent
Nakatsuka et al.

(10) Patent No.: US 11,244,877 B2
(45) Date of Patent: Feb. 8, 2022

(54) SEALING STRUCTURE AND MANUFACTURING METHOD THEREOF

(71) Applicant: Hitachi, Ltd., Tokyo (JP)

(72) Inventors: Tetsuya Nakatsuka, Tokyo (JP); Shinya Kawakita, Tokyo (JP); Susumu Ishida, Tokyo (JP); Isamu Yoshida, Tokyo (JP); Osamu Ikeda, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 555 days.

(21) Appl. No.: 16/088,263

(22) PCT Filed: Apr. 4, 2016

(86) PCT No.: PCT/JP2016/061024
§ 371 (c)(1),
(2) Date: Sep. 25, 2018

(87) PCT Pub. No.: WO2017/175274
PCT Pub. Date: Oct. 12, 2017

(65) Prior Publication Data
US 2020/0303272 A1      Sep. 24, 2020

(51) Int. Cl.
*H01L 23/24* (2006.01)
*H01L 21/54* (2006.01)
(Continued)

(52) U.S. Cl.
CPC ........ *H01L 23/24* (2013.01); *B29C 45/14639* (2013.01); *H01L 21/54* (2013.01); *H01L 23/3135* (2013.01); *H01L 23/42* (2013.01);
*B29K 2067/00* (2013.01); *B29K 2705/02* (2013.01); *B29L 2031/3406* (2013.01)

(58) Field of Classification Search
CPC ..... H01L 21/54; H01L 23/24; H01L 23/3135; H01L 23/3675; H01L 23/42
See application file for complete search history.

(56) References Cited

U.S. PATENT DOCUMENTS 6,818,974 B2 * 11/2004 Yokoyama .............. H01L 23/04
257/676
2004/0026777 A1    2/2004 Yokoyama et al.
(Continued)

FOREIGN PATENT DOCUMENTS

JP          61-4721 A      1/1986
JP          5-67893 A      3/1993
(Continued)

OTHER PUBLICATIONS

International Search Report (PCT/ISA/210) issued in PCT Application No. PCT/JP2016/061024 dated May 24, 2016 with English translation (five pages).
(Continued)

*Primary Examiner* — Zandra V Smith
*Assistant Examiner* — Abbigale A Boyle
(74) *Attorney, Agent, or Firm* — Crowell & Moring LLP

(57) ABSTRACT

Provided is a sealing structure including a housing that houses a heat generating member or a heat dissipation member thereinside, and a resin that is filled in the housing. In a sectional view, the housing includes a first recess portion in a position facing the heat generating member or the heat dissipation member.

6 Claims, 7 Drawing Sheets

(51) Int. Cl.
    *H01L 23/42*     (2006.01)
    *B29C 45/14*     (2006.01)
    *H01L 23/31*     (2006.01)
    *B29K 67/00*     (2006.01)
    *B29K 705/02*     (2006.01)
    *B29L 31/34*     (2006.01)

(56) References Cited

U.S. PATENT DOCUMENTS

| | | |
|---|---|---|
| 2011/0096505 A1 | 4/2011 | Inoue |
| 2013/0250521 A1 | 9/2013 | Kawai et al. |
| 2015/0163958 A1 | 6/2015 | Oguma et al. |

FOREIGN PATENT DOCUMENTS

| | | |
|---|---|---|
| JP | 5-93091 U | 12/1993 |
| JP | 8-17853 A | 1/1996 |
| JP | 2002-280776 A | 9/2002 |
| JP | 2004-71977 A | 3/2004 |
| JP | 2006-313768 A | 11/2006 |
| JP | 2011-35106 A | 2/2011 |
| JP | 2011-54640 A | 3/2011 |
| JP | 2013-123063 A | 6/2013 |
| JP | 2013-197405 A | 9/2013 |
| WO | WO 2013/187298 A1 | 12/2013 |

OTHER PUBLICATIONS

Japanese-language Written Opinion (PCT/ISA/237) issued in PCT Application No. PCT/JP2016/061024 dated May 24, 2016 (four pages).

* cited by examiner

[FIG. 1]
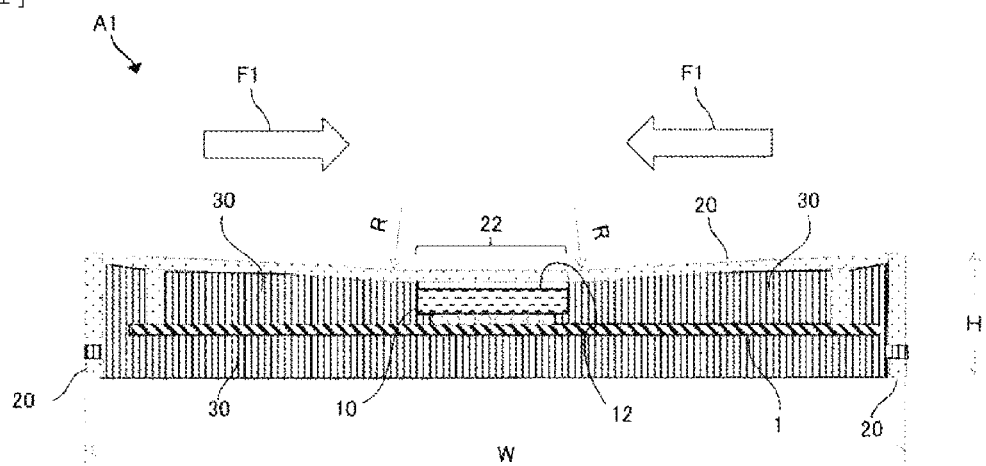
[FIG. 2]
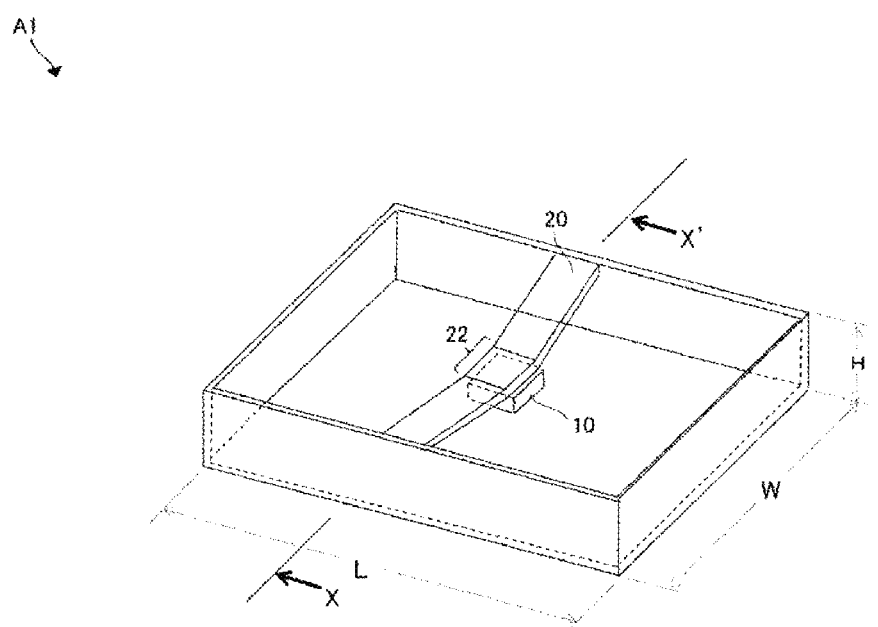

[FIG. 3]
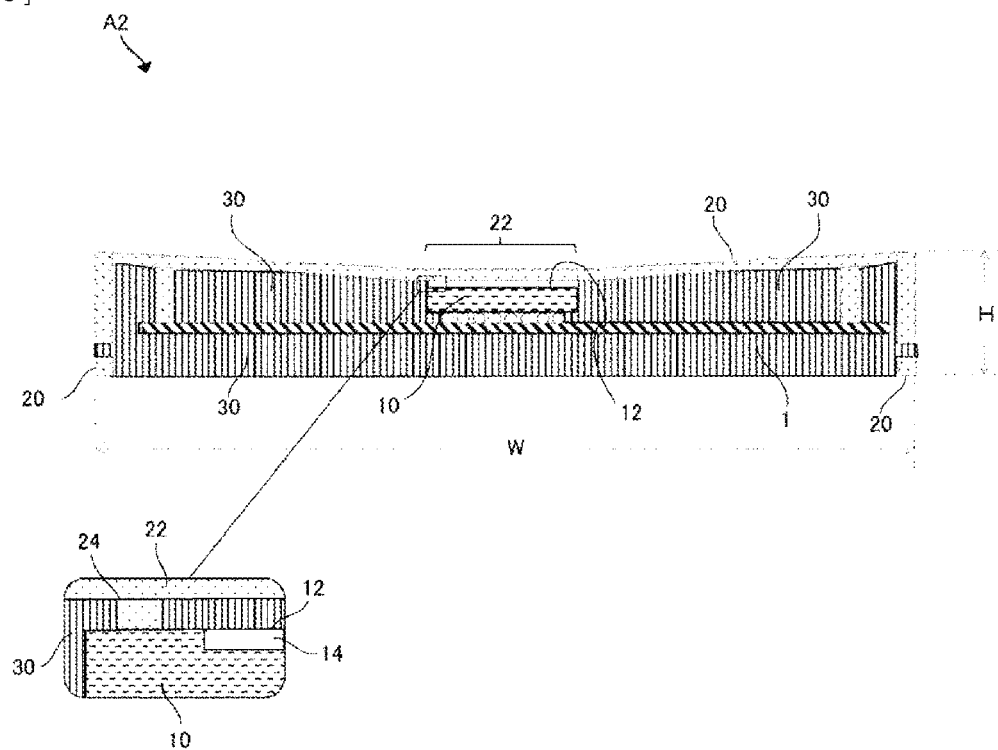

[FIG. 4]
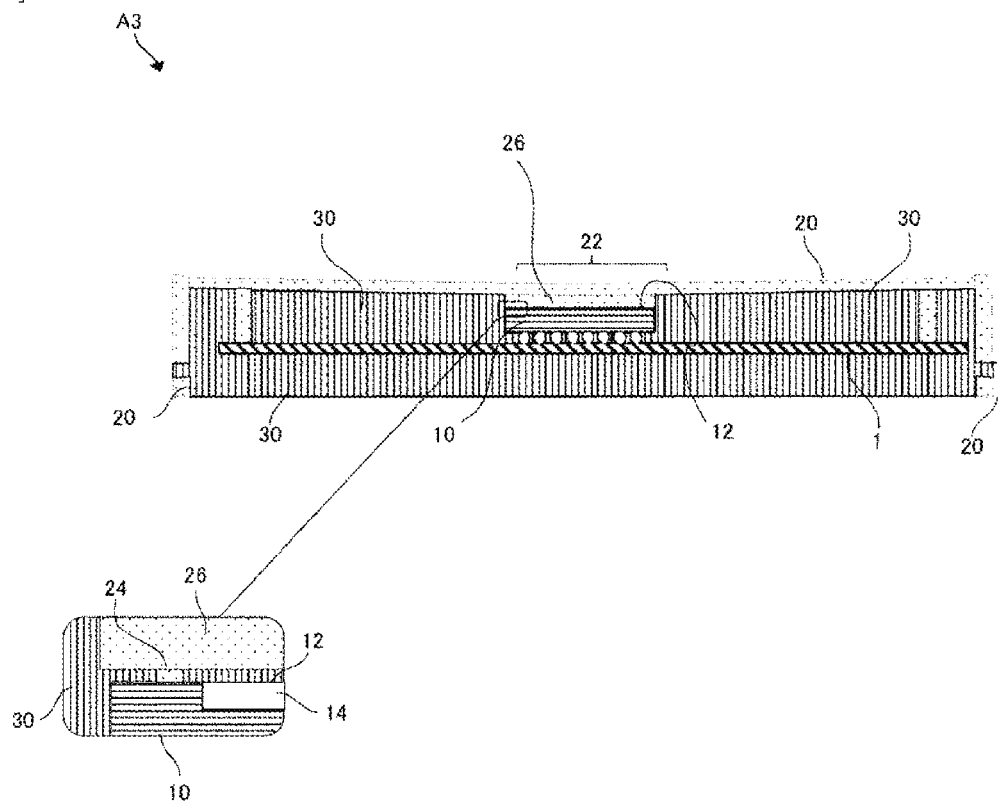

[FIG. 5]
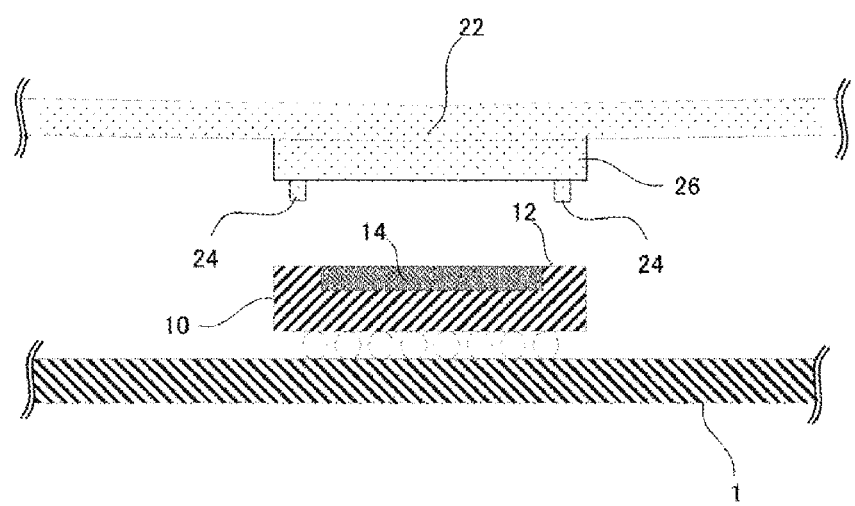

[FIG. 6]
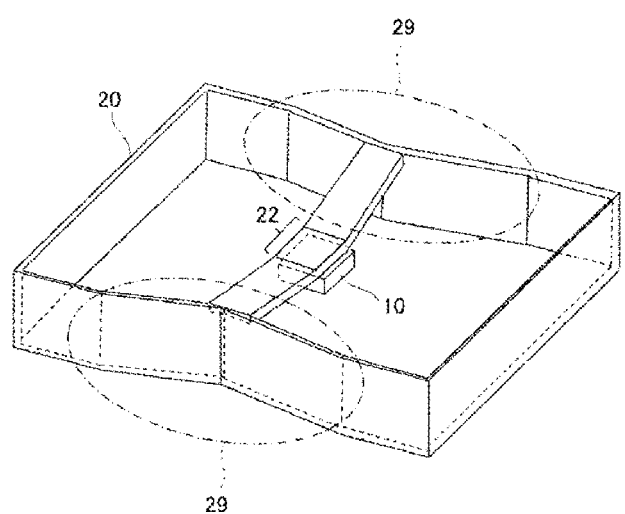
[FIG. 7]
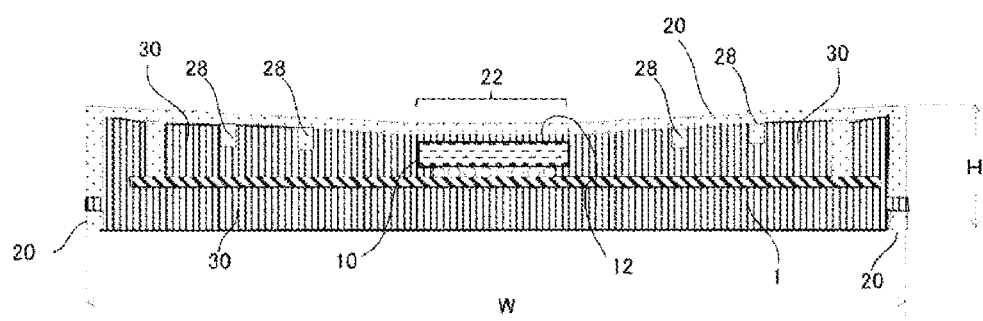

[FIG. 8]
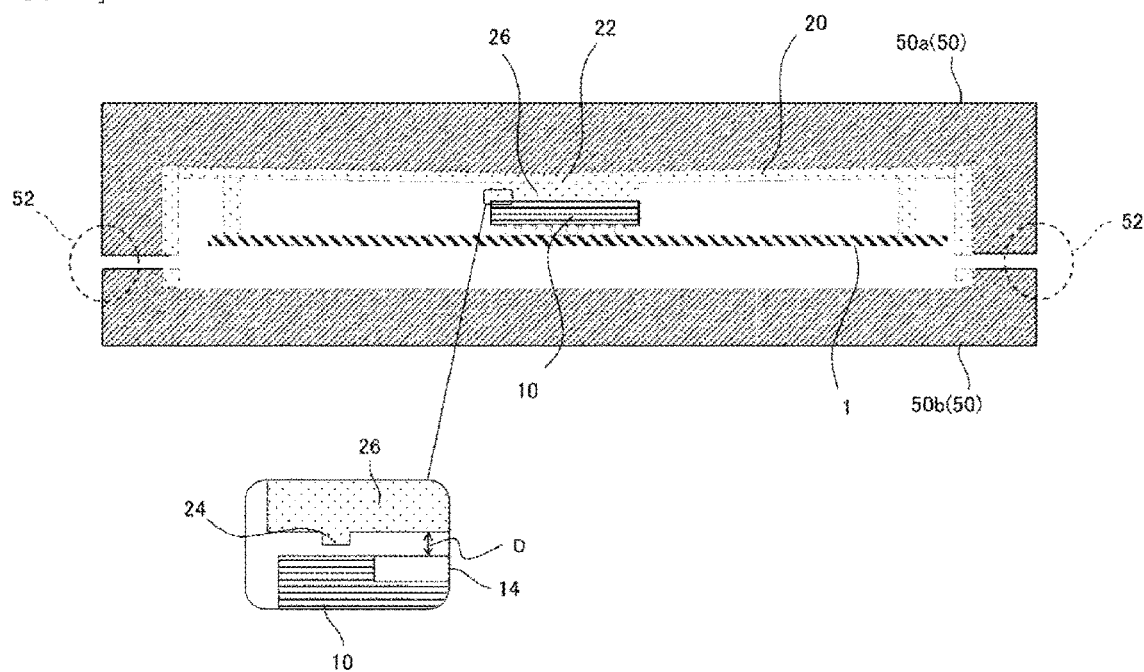

[FIG. 9]
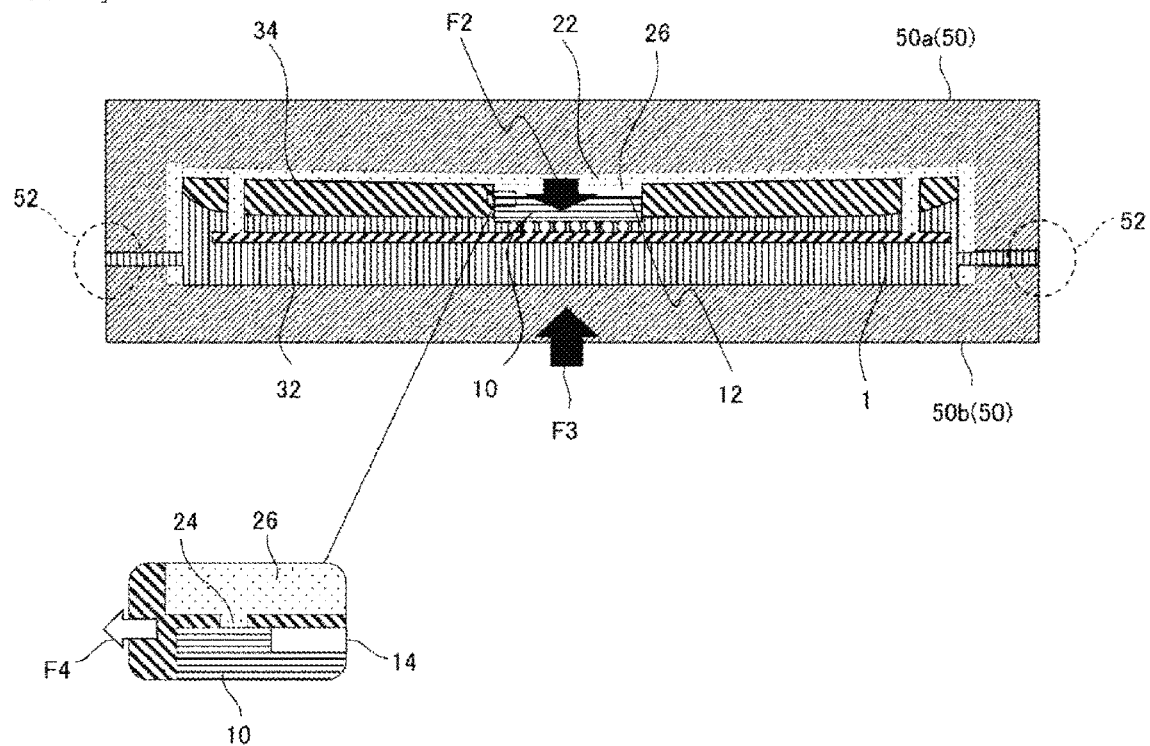
[FIG. 10]
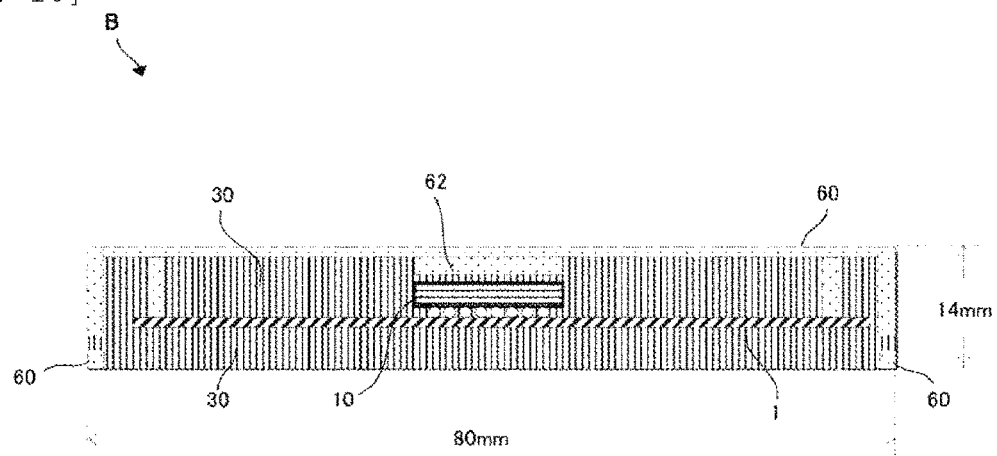

SEALING STRUCTURE AND MANUFACTURING METHOD THEREOF

TECHNICAL FIELD

The present invention relates to a sealing structure and a manufacturing method thereof.

BACKGROUND ART

In paragraph 0002 of JP-A-2013-123063 (PTL 1), it is described that "when a surface-mounting type semiconductor device is mounted in a wiring substrate (hereinafter, simply referred to as a substrate)", "a semiconductor chip HC is mounted by being connected through a flip-chip bonding method in a substrate KR in which a wiring pattern is formed".

In paragraphs 0005 and 0006 of JP-A-2013-123063 (PTL 1), it is described that "in the semiconductor device in which the semiconductor chip is mounted in the wiring substrate through flip-chip bonding," "underfill is filled before a fillet part of the semiconductor device is formed".

CITATION LIST

Patent Literature

PTL 1: JP-A-2013-123063

SUMMARY OF INVENTION

Technical Problem

The semiconductor device in which the semiconductor element is mounted in the substrate is used in various electronic devices. The semiconductor device is needed to have sophisticated design in order to cope with recent function improvement, size reduction, and speed improvement in the electronic device.

By exemplifying a car electronics field or the like, an electronic control unit (ECU) or the like using the semiconductor device is mounted in an engine room with high temperature and large vibration.

As described above, there is the semiconductor device which is used under a harsh high-temperature environment, and a high thermal resistance is required for such a semiconductor device.

As the countermeasure thereto, attempts have been made that a sealing structure or the like obtained by sealing a metal housing in which the semiconductor element, the substrate, and the like are arranged with a resin is used to dissipate heat to the outside through the housing.

However, there is still room for improvement in terms of the heat dissipation efficiency of the above-described sealing structure.

For example, the heat dissipation efficiency is not improved sufficiently only by housing a heat generating member such as a semiconductor element in the housing. It is required that a member such as a heat dissipation sheet or a heat dissipation pad is additionally provided inside the housing or a large space is secured in the housing.

When the number of the members is increased, the design freedom or the size reduction of the semiconductor device is limited.

Otherwise, a manufacturing process of the semiconductor device becomes complicated or expensive. Such a problem on the thermal design becomes prominent in the sealing structure relating to the semiconductor device which is used under the harsh environment with high temperature and large vibration such as the car electronics field.

The invention has been made in consideration of the above situation, and an object thereof is to provide a sealing structure which is excellent in a heat dissipation efficiency.

Solution to Problem

This application includes a plurality of units for solving at least part of the above-described problems, and an example of the plurality of units is as follows.

In order to solve the above-described problems, a sealing structure according to the invention includes: a housing which houses a heat generating member or a heat dissipation member thereinside; and a resin which is filled in the housing. In a sectional view, the housing includes a first recess portion in a position facing the heat generating member or the heat dissipation member.

A following manufacturing method can be used as one example of a manufacturing method of a sealing structure according to the invention. The manufacturing method of the sealing structure, which includes a housing which houses a heat generating member or a heat dissipation member thereinside, and a resin which seals an inner portion of the housing, includes steps of: filling the resin which is shrunk during curing in the housing; gradually curing a resin which is filled in a circumferential edge area of the inner portion of the housing prior to a resin which is filled in an area near a gap between the heat generating member or the heat dissipation member and the housing; and narrowing the gap by shrinkage of the resin during the curing.

Advantageous Effects of Invention

According to the invention, the sealing structure can be provided which is excellent in the heat dissipation efficiency. The problems, configurations, and effects other than those described above will become apparent from the following description of embodiments.

BRIEF DESCRIPTION OF DRAWINGS

FIG. 1 is a sectional view illustrating a first aspect of a sealing structure according to this embodiment.

FIG. 2 is a schematically perspective view for explaining a positional relation between a semiconductor element 10 and a housing 20 in the first aspect of the sealing structure according to this embodiment.

FIG. 3 is a sectional view illustrating a second aspect of the sealing structure according to this embodiment.

FIG. 4 is a sectional view illustrating a third aspect of the sealing structure according to this embodiment.

FIG. 5 is a partially sectional view for explaining an area near a heat conducting member 26 in the third aspect of the sealing structure according to this embodiment.

FIG. 6 is a schematically perspective view for explaining a positional relation between the semiconductor element 10 and the housing 20 in a fourth aspect of the sealing structure according to this embodiment.

FIG. 7 is a sectional view illustrating a fifth aspect of the sealing structure according to this embodiment.

FIG. 8 is a sectional view for explaining a state before a resin is filled in one example of a manufacturing method according to this embodiment.

FIG. 9 is a sectional view for explaining a state after the resin is filled in one example of the manufacturing method according to this embodiment.

FIG. 10 is a sectional view illustrating a sealing structure B according to a first reference example.

DESCRIPTION OF EMBODIMENTS

Hereinafter, the embodiment for carrying out the invention (hereinafter, simply referred to as "this embodiment") is described in detail with reference to the drawings as needed.

The following embodiment is presented as exemplification for describing the invention, and the invention is not intended to be limited to the following contents. Further, the invention can be carried out as appropriately modified within the scope of the gist of the invention.

Incidentally, in the drawings, the same reference numerals are denoted by the same elements in principle, and the redundant explanation is not repeated. In addition, a positional relation such as upper and lower sides and right and left sides is based on the positional relation illustrated in the drawings unless otherwise noted. First, the dimensional ratios of the drawings are not limited to the ratios as illustrated herein.

In this specification, the term marked with "substantially" indicates the meaning of the terms except the term "substantially" in the purview of those skilled in the art, and the meaning itself other than "substantially" is also included.

<Sealing Structure>

A sealing structure according to this embodiment includes a housing which houses a heat generating member or a heat dissipation member therein and a resin which is filled in the housing. The sealing structure is formed such that in a sectional view, a housing includes a first recess portion in a position facing the heat generating member or the heat dissipation member.

The first recess portion is provided such that an upper surface of the heat generating member or the heat dissipation member and an inner surface of the housing can be brought closer to each other. Accordingly, it is possible to improve a heat dissipation efficiency.

In the related art, in the thermal design of the housing, a detailed examination is not made on a behavior of a molten resin at the time of filling the molten resin in the housing.

The present inventors focus on the behavior of the molten resin, and consider that the heat dissipation efficiency may be improved in the housing structure which can control the behavior of the molten resin.

A keen examination is made based on the knowledge that a housing design should be used which can use a curing shrinkage force of a resin. As a result, the inventors have come to conceive a sealing structure according to this embodiment (however, the effects of this embodiment are not limited thereto.)

In this embodiment, a heat generating member means a member which heats itself. An element group is exemplified which generates the heat according to the on-resistance by flowing a current.

The detailed example of the heat generating member is not limited particularly, and includes a semiconductor element (such as a transistor, a Peltier element, a silicon device, and a power semiconductor device), a capacitor, a resistor, a thermoelectric device, a motor, and various heat sources.

In this embodiment, the heat dissipation member is a member which transfers the heat generated from another member by itself to dissipate the heat to the outside.

The detailed example of the heat dissipation member is not limited particularly, and includes a heat sink which dissipates the heat generated from a self-heating body such as a semiconductor element and a molded semiconductor element.

For example, in the case of a power device or like, the generated heat is much, but the heat is transferred through the heat dissipation member such as a heat sink. Thus, in such a case, much heat is dissipated from the heat sink.

The heat generating member and the heat dissipation member are common in that the heat is released to the outside. Thus, hereinafter, unless otherwise noted, the case of the description of the heat generating member (heat dissipation member) means the heat generating member or the heat dissipation member, or both of them.

The aspects of the sealing structure according to this embodiment will be described by using the drawings.

FIG. 1 is a sectional view illustrating a first aspect of the sealing structure according to this embodiment. FIG. 2 is a schematically perspective view for explaining a positional relation between a semiconductor element 10 and a housing 20 in the same aspect.

In a sealing structure A1, the semiconductor element 10 arranged on a substrate 1 is housed in the housing 20. The sealing structure A1 includes the housing 20 which houses the semiconductor element 10 therein and a resin 30 which is filled in the housing 20.

In the manufacturing method (to be described later), the resin 30 seals the semiconductor element 10 by filling and curing the molten resin 30 in the housing 20.

Incidentally, as apparent from the fact that the semiconductor element 10 is mounted, the sealing structure A1 is an example in which the heat generating member is used between the above-described heat generating member and heat dissipation member.

The aspects (to be described later) of this embodiment are examples of a case where the semiconductor element 10 is used as the heat generating member. Thus, unless otherwise noted, the configuration of this embodiment may be adopted in the heat generating member other than the semiconductor element or various sealing structures which use the heat dissipation member.

In a sectional view of an X-X' direction of FIG. 2, the housing 20 includes a first recess portion 22 in a position facing the semiconductor element 10.

More specifically, the housing 20 includes a side wall which stands on the substrate 1 and an upper portion which has a ceiling surface which connects an opening formed by the side wall. In a sectional view along a longitudinal direction of the ceiling surface, the inner surface of the ceiling surface positioned substantially above a heating part has a recess shape when viewed from the outside of the housing 20 (when viewed downward from the upper side of FIG. 1).

In other words, the inner surface of the ceiling surface which is positioned substantially above the heating part has a convex shape toward the semiconductor element 10 when viewed from the outside of the housing 20 (when viewed upward from the lower side of FIG. 1).

That is, a first recess portion 22 which is the portion corresponding to the semiconductor element 10 and a beam portion which is the portion which is connected from the side surface portion of the housing 20 to the first recess portion 22 have different heights compared to the height of the surface of the substrate 1 as a reference.

The height of the beam portion is decreased gradually from the side surface portion of the housing 20 toward the first recess portion 22. Incidentally, the connection part between the first recess portion 22 and the beam portion may be almost the same height.

For example, in a case where a plate metal member is bent to mold the first recess portion 22 and the beam portion, the connection part has the same height.

Preferably, the bottom surface portion of the first recess portion 22 is substantially in parallel with the upper surface of the semiconductor element 10. This is because the distance between the bottom surface portion of the first recess portion 22 and the upper surface of the semiconductor element 10 can be reduced, and the heat dissipation characteristic can be improved in that case.

In that case, the first recess portion 22 and the beam portion have different angles.

A gap is provided between the semiconductor element 10 and the first recess portion 22 to such a degree not to inhibit the flow of the resin 30 (for example, 300 μm to 400 μm approximately) at the time of filling the molten resin 30. The gap is provided so that the resin 30 can be filled without a void.

The shape of the first recess portion 22 is not limited particularly, and may be various shapes such as an arc shape, a rectangular shape, a V-shaped shape, and a U-shaped shape in a sectional view of the X-X' direction of FIG. 2.

Incidentally, preferably, a curvature radius R (see FIG. 1) of the curved portion of the recess-shaped surface is small. Specifically, the curvature radius is preferably 20 mm or less, more preferably 15 mm or less, and more preferably 10 mm or less.

The molten resin filled in the housing 20 is filled from the outside of the inner portion of the housing 20 toward the inner side (from the circumferential edge of the housing toward the place where the semiconductor element 10 is arranged) (see arrow F1 of FIG. 1).

When the curvature radius of the first recess portion 22 is small, it is possible to further lessen the recess shape of the first recess portion 22. From such a viewpoint, preferably, the shape of the first recess portion 22 is a V shape or a U shape.

For example, in the case of the V shape, the shape is a structure in which both ends of the recess shape of the first recess portion 22 are connected by a linear line, and the curvature radius R is small. Thus, the V shape is included as a preferred example of the recess portion in "the recess shape" in concept.

As for the optimization of an adhesion strength or an adhesion distance of the resin 30 with respect to the surface of the housing 20, the adjustment can be performed with a higher degree of accuracy by controlling the structure dimension or the shape of the housing 20.

The material of the housing 20 is not limited particularly, and may be formed of a metal plate material such as an aluminum die cast, stainless steel, and steel. The first recess portion 22 may be integrated with the housing 20 or may be a separate member as a member.

Although not illustrated, in the housing 20, the first recess portion 22 may be formed in a recess shape in such a manner that a groove (cutting line) is provided to be directed to be bent in the recess shape.

Accordingly, in the manufacturing process of the housing 20, it is possible to simplify the processes and to reduce manufacturing costs.

The resin 30 seals the semiconductor element 10 in such a manner that the resin in a molten state is filled and cured in the housing 20.

As long as the resin 30 can be molten and cured, the kinds thereof are not limited particularly. Preferably, the resin 30 is a thermosetting resin which shrinks at the time of curing.

The detailed example of the thermosetting resin is not limited particularly. The example includes an unsaturated polyester, an epoxy resin, an amino resin, a polyurethane resin, a silicone resin, and a thermosetting polyimide resin.

The thermosetting resin may be used as a single kind, or two kinds of thermosetting resins may be used in combination. In addition, for example, the thermosetting resin may be a two liquid-type curing agent or the like.

In a case where the thermosetting resin is used as the resin 30, first, the thermosetting resin of the molten state is filled in the housing 20 and is cured by the heat, and the sealing is completed. In the period of the curing from the molten state, the thermosetting resin is accompanied by the change such as a crosslink density or a volume shrinkage resulting from a chemical reaction.

As a result, there occurs an inner residual stress or a residual strain in the housing 20 after the curing. The force caused by such shrinkage is referred to as a curing shrinkage force.

In the related art, from a reason such as the deformation or another cause, the curing shrinkage force is not considered to be preferable in a resin molding technique. At that point, the inventors largely change a way of thinking and find out a housing structure which can control the curing shrinkage force.

By using the housing structure, it is possible to control the filling of the resin 30 simply and precisely, and it is possible to contribute to the improvement of the thermal design of the sealing structure A1.

In this embodiment, within a range that does not inhibit the curing of the resin 30, a thermoplastic resin, a thermosetting accelerator, a crosslinking agent, a flux agent, another inorganic filler, or the like may be further compound in the resin 30 as necessary.

The thermoplastic resin is not limited particularly. The example of the thermoplastic resin includes a butyl rubber, an isoprene rubber, a chloroprene rubber, an ethylene-vinyl acetate copolymer, an ethylene-acrylic acid copolymer, an ethylene-acrylate copolymer, a polybutadiene resin, a polycarbonate resin, a thermoplastic polyimide resin, a polyamide resin such as nylon 6 and nylon 6,6, a phenoxy resin, an acrylic resin, a saturated polyester resin such as PET or PBT, a polyamide-imide resin, and a fluorocarbon resin.

The thermoplastic resin may be used as a single kind, or two kinds of thermoplastic resins may be used in combination.

The thermosetting accelerator is not limited particularly. The known thermosetting accelerator can be selected as appropriate according to the kind of the used resin.

A thermal cure promoting catalyst is not limited particularly. The example of the thermal cure promoting catalyst includes an amine-based curing accelerator, a phosphorus-based curing accelerator, an imidazole curing accelerator, a boron-based curing accelerator, a phosphorous-boron-based curing accelerator, or the like.

The thermal cure promoting catalyst may be used as a single kind, or two kinds of thermal cure promoting catalysts may be used in combination.

The crosslinking agent is not limited particularly. The known crosslinking agent can be selected as appropriate according to the kind of the used resin.

The crosslinking agent is not limited particularly. The example of the crosslinking agent includes a tolylene diisocyanate, a diphenylmethane diisocyanate, a p-phenylene diisocyanate, a 1,5-naphthalene diisocyanate, and a polyisocyanate compound such as an appendage of a polyhydric alcohol and a diisocyanate.

The flux agent is not limited particularly. The known flux agent can be selected as appropriate.

The flux agent is not limited particularly. The example of the flux agent includes diphenolic acid, adipic acid, acetylsalicylic acid, benzoic acid, benzilic acid, azelaic acid, benzyl benzoate, malonic acid, 2,2-bis (hydroxymethyl) propionic acid, salicylic acid, o-methoxybenzoic acid, m-hydroxybenzoic acid, succinic acid, 2,6-dimethoxymethyl paracresol, hydrazide benzoate, carbohydrazide, dihydrazide malonate, dihydrazide succinate, dihydrazide glutarate, hydrazide salicylate, dihydrazide iminodiacetate, dihydrazide itaconate, trihydrazide citrate, thiocarbohydrazide, benzophenone hydrazone, 4,4'-oxybisbenzenesulfonyl hydrazide, and dihydrazide adipate.

Another inorganic filler is not limited particularly. The known inorganic filler can be selected as appropriate according to a desired property.

The example of the inorganic filler includes silicate such as talc, clay, mica, and glass, oxide such as titanium oxide, molten silica, crystalline silica, and alumina; carbonate such as calcium carbonate, magnesium carbonate, and hydrotalcite; hydroxide such as aluminium hydroxide, magnesium hydroxide, and calcium hydroxide; sulfate or sulfite such as barium sulfate, calcium sulfate, and calcium sulphite; and aluminum nitride, boron nitride, and silicon nitride.

For example, by using molten silica, crystalline silica, or the like, the thermal resistance, the moisture resistance, and the strength are improved.

In this embodiment, the sealing structure may be used which is shrunk and cured in a recess direction of the first recess portion 22 of the housing 20.

When the mold resin is cured, a line remains in a flowing direction. That is, by carrying out this embodiment, the line remains along the beam portion when the molten resin is cured. The line is made along the beam portion to be strong against the compressive stress from the upper surface of the housing 20.

As described above, the determination can be performed by cutting the curable resin filled in the sealing structure and observing the appearance of the sectional surface thereof.

As described above, according to the sealing structure A1 to which the curing shrinkage force is applied which is enough to check whether the curing shrinkage force is present, the heat dissipation efficiency can be obtained which is excellent in the thermal design of the sealing structure A1.

The compressive stress is higher in the vicinity of the beam portion which connects the housing 20 and the first recess portion 22 than in the vicinity of the substrate 1. This is because the beam portion is stretched to the substrate 1 side when the resin is cured.

Accordingly, the adhesiveness between the semiconductor element 10 and the first recess portion 22 is improved. Further, the heat dissipation characteristic is improved by improving the adhesiveness.

Such a line may be based on the evaluation of the appearance with respect to the surface of the cured resin or may be based on a quantitative evaluation according to a curing shrinkage ratio.

For example, the above-described curing shrinkage ratio can be evaluated quantitatively based on an indicator such as the curing shrinkage ratio (%)=(specific gravity of cured product−specific gravity before curing)/specific gravity of cured product×100. In a case where the curing shrinkage ratio is not 0%, the evaluation can be made that it is caused by the curing shrinkage force.

FIG. 3 is a sectional view illustrating a second aspect of the sealing structure according to this embodiment. In a sealing structure A2, a first protrusion 24 which abuts on the semiconductor element 10 is provided in the first recess portion 22 of the housing 20 in the above-described sealing structure A1.

In a case where the first protrusion 24 abuts on the semiconductor element, it is advantageous in that it is easy to secure a positional relation between the first recess portion 22 and the semiconductor element 10. Incidentally, the embodiment can be carried out although the first protrusion 24 does not abut on the semiconductor element. In that case, the flow path of the molten resin is adjustable.

More specifically, in a sectional view of the ceiling surface of the above-described housing 20 along the longitudinal direction, the housing 20 includes the first protrusion 24 provided in the position facing the semiconductor element 10 on the inner surface of the ceiling surface thereof.

That is, the first protrusion 24 is arranged between the upper surface of the semiconductor element 10 and the first recess portion 22.

The first protrusion 24 is provided so as to more reliably secure a gap between a heat dissipation surface 12 of the semiconductor element 10 and the first recess portion 22. As a result, it is possible to more reliably maintain the insulation property of the semiconductor element 10 (or an insulation portion 14 in the semiconductor element 10).

The number or the position of the first protrusions 24 is not limited particularly. For example, in a case where the semiconductor element 10 is rectangular, the first protrusion 24 can be provided in each of four corners.

The shape or the magnitude of the protrusion 24 is not limited particularly. For example, the shape may be a rectangular parallelepiped shape, a columnar shape, and a truncated cone shape. Further, the shape may be a frog shape, a pear skin shape, an embossed shape, or the like.

The first protrusion 24 can be carried out to be connected with the first recess portion 22. In addition, the first protrusion 24 can be molded by extrusion, pressing, or the like.

FIG. 4 is a sectional view illustrating a third aspect of the sealing structure according to this embodiment. FIG. 5 is a partially sectional view for explaining the area near a heat conducting member 26 in the same aspect.

In a sealing structure A3, the heat conducting member 26 is provided in the position facing the semiconductor element 10 in the first recess portion 22 of the housing 20 in the above-described sealing structure A2. More specifically, the heat conducting member 26 is provided between the first recess portion 22 and the first protrusion 24.

A member which has a same or a higher thermal conductivity than the resin 30 is used as the heat conducting member 26. Accordingly, it is possible to efficiently transfer the heat of the semiconductor element 10 to the first recess portion 22.

That is, the heat is transferred to the semiconductor element 10, the resin 30 which is arranged between the semiconductor element 10 and the heat conducting member 26, and the first recess portion 22.

In a first modification, in a case where the thermal conductivity of the heat conducting member 26 is higher than two members of the first recess portion 22 and the resin 30 which is arranged between the semiconductor element 10 and the heat conducting member 26, the heat is transferred from the semiconductor element 10 through the resin 30 arranged between the semiconductor element 10 and the heat conducting member 26 to the heat conducting member 26, which is effective.

In a second modification, in a case where the thermal conductivity is higher in order of the first recess portion 22, the heat conducting member 26, and the resin 30 which is arranged between the semiconductor element 10 and the heat conducting member 26, the thermal conductivity is higher in order from the semiconductor element 10, and further the heat is transferred efficiently, which is effective.

That is, in the sealing structure A3, in a sectional view of the ceiling surface of the housing 20 in the longitudinal direction, the housing 20 includes, on the inner surface of the ceiling surface thereof, the first recess portion 22 provided to the position facing the semiconductor element 10, the heat conducting member 26 provided on the surface of the first recess portion 22, and the first protrusion 24 provided on the surface of the heat conducting member 26.

In a case where the member of the first protrusion 24 is an insulation member, although the heat dissipation surface 12 of the semiconductor element 10 is a metal member, the first recess portion 22 or the heat conducting member 26 can be made as a metal member.

Since the member of the first protrusion 24 is an insulation member, the contact between the metal members can be avoided by the resin 30 and the first protrusion 24.

Accordingly, the metal portion of the semiconductor element 10 can be carried out although being connected to ground. In addition, a metal member having a high thermal conductivity can be adopted as the first recess portion 22 or the first protrusion 24 which is arranged close to the semiconductor element 10.

The two-stepwise protrusion shape formed of the heat conducting member 26 and the first protrusion 24 is provided in the first recess portion 22, so as to more reliably prevent the surface contact of the first recess portion 22 or the heat conducting member 26 and the insulation portion 14 of the semiconductor element.

Accordingly, it is possible to more reliably maintain the insulation property. As a result, it is possible to further improve the quality of the semiconductor element in an electrical characteristic.

As for the gap between the surface of the housing 20 and the heat dissipation surface 12 of the semiconductor element 10, there is an advantage that the surface contact between the housing 20 and the semiconductor element 10 can be prevented reliably although a minute variation occurs locally.

As a result, the housing 20 can be brought sufficiently close to the heat dissipation surface 12 of the semiconductor element 10 to an extent that the housing 20 does not surface-contact with the semiconductor element 10. Further, without changing the structure design of the ceiling surface of the housing 20 largely, it is possible to maintain the distance from the semiconductor element 10 with higher accuracy.

The shape or the magnitude of the heat conducting member 26 is not limited particularly. The shape or the magnitude can be properly adopted as appropriate in consideration of the structure design or the like of the sealing structure A3.

The detailed example of the shape of the heat conducting member 26 includes a planar shape, a sheet shape, a pad shape, and a columnar shape. Further, the minute heat conducting member 26 may be arranged between the first recess portion 22 and the heat dissipation surface 12.

Incidentally, in FIGS. 4 and 5, an aspect which includes the heat conducting member 26 and the first protrusion 24 is illustrated as one example. However, in this embodiment, the heat conducting member 26 and the first protrusion 24 are not included necessarily. A desired structure design may be configured to include any one of the heat conducting member 26 and the first protrusion 24.

FIG. 6 is a schematically perspective view for explaining the positional relation between the semiconductor element 10 and the housing 20 in a fourth aspect of the sealing structure according to this embodiment.

In the above-described sealing structure A1, in the sealing structure A4, the side wall which supports the first recess portion 22 is included, and a second recess portion 29 is formed in the side wall.

More specifically, in the side wall which supports the first recess portion 22, the two second recess portions 29 are formed in the vicinity of the places which are connected with the ceiling surface provided with the first recess portion 22.

That is, the sealing structure A4 is an example of the housing 20 which has a plurality of recess shapes (the first recess portion 22 as the recess portion of the ceiling surface and the second recess portion 29 as the recess portion of the side wall).

The higher compressive stress is applied to the vicinity of the second recess portion 29 compared to the vicinity of the substrate 1. The higher compressive stress is applied to the periphery provided with the second recess portion 29 compared to the other portion. This is because the tension is applied to the second recess portion 29 which is the side wall of the housing 20 during the curing.

Accordingly, the adhesiveness between the semiconductor element 10 and the first recess portion 22 is improved. Further, the heat dissipation characteristic is improved by improving the adhesiveness.

As mentioned in the description of the manufacturing method (to be described later), the plurality of recess shapes are provided so that the behavior of the molten resin can be controlled with higher accuracy.

FIG. 7 is a sectional view illustrating a fifth aspect of the sealing structure according to this embodiment. In the sealing structure A5, the second protrusion 28 which protrudes inward is provided in a position different from the first recess portion 22 in the above-described sealing structure A1.

More specifically, in a sectional view of the ceiling surface of the above-described housing 20 along the longitudinal direction, the housing 20 includes the second protrusion 28, which is provided in a position not facing the semiconductor element 10, on the inner surface of the ceiling surface thereof.

When the molten resin 30 is filled and cured in the housing 20, the curing shrinkage force of the resin 30 is generated. As for the curing collection force, a variation is generated locally such that the curing shrinkage force is large in some place of the housing 20 and is small in other place.

Even in the case, the second protrusion 28 can act on and control the flow of the molten resin during filling.

As a result, it is possible to more effectively prevent the phenomenon that the cured resin 30 is peeled off from the housing 20 and to further stabilize the filling of the resin 30. Further, the manufacturing defect can be reduced to contribute to the improvement of yield.

As described above, the second protrusion 28 is provided in the circumferential edge (the area far from the semiconductor element 10) of the inner surface of the housing to function as an anchor which controls the movement of the molten resin before arriving at the semiconductor element 10.

The shape of the second protrusion 28 is not limited particularly. However, the surface may protrude in the inner direction of the housing 20. Specifically, the shape may be a rectangular parallelepiped shape, a columnar shape, a truncated cone shape, and further a pear skin shape or an embossed shape.

The second protrusion 28 can be carried out to be connected with the beam portion which is connected with the first recess portion 22 and the upper portion of the side surface of the housing 20. In addition, the second protrusion 28 can be molded by extrusion, pressing, or the like.

<Manufacturing Method>

The description will be given about a proper manufacturing method of the above-described sealing structure in this embodiment. Incidentally, the redundant content is not given with respect to the above-described description of the structure or the like of the sealing structure.

In the manufacturing method according to this embodiment, preferably, the manufacturing method of the sealing structure which includes the housing which houses the heat generating member (heat dissipation member) inside, and the resin which seals an inner portion of the housing includes steps of:

filling the resin which is shrunk during curing in the housing;

gradually curing a resin which is filled in a circumferential edge area of the inner portion of the housing prior to a resin which is filled in an area near a gap between the heat generating member or the heat dissipation member and the housing; and narrowing the gap by shrinkage of the resin during the curing.

The manufacturing method of the sealing structure is not limited to the manufacturing method. However, according to the manufacturing method, in the housing in which the molten resin is not filled, although the housing does not have the shape (recess shape) of the above-described first recess portion, the inner surface of the ceiling surface of the housing can be formed in a recess shape by using the curing shrinkage force of the molten resin.

It is a matter of course that the housing including the first recess portion 22 may be prepared in advance and be used.

As one example, the manufacturing method of the sealing structure A3 according to the third embodiment (FIGS. 4 and 5) is described.

FIG. 8 is a sectional view for explaining a state before the resin is filled in the same manufacturing method.

FIG. 9 is a sectional view for explaining a state after the resin is filled in the same manufacturing method.

First, as illustrated in FIG. 8, in the semiconductor element 10, the housing 20 temporarily arranged in the inner portion is arranged in an upper die 50a and a lower die 50b (which are referred to as a die 50 hereinafter). The die 50 includes a heater (not illustrated).

Two gates 52 for introducing the molten resin are provided in the circumferential edge of the die 50. When the housing 20 is arranged in the die 50, the first protrusion 24 does not abut on the surface of the semiconductor element 10, and a certain gap D is formed.

Next, the resin 30 which is shrunk during the curing is filled in the housing 20. As illustrated in FIG. 9, the molten resin 30 is introduced by the gate 52. The introduced molten resin 30 flows into the housing 20, and the inner space of the housing 20 is filled with the molten resin 30.

When the molten resin 30 (for example, a thermosetting resin such as unsaturated polyester) is introduced from the gate 52 into the die 50, air in the die 50 comes out, and the space of the die 50 is filled with the resin 30.

The resin is gradually cured in a direction which is closer from the position separated from the position of the gap between the semiconductor element 10 and the housing 20. By using FIG. 9 as an example, the inner area of the housing 20 is heated by the heater, and the heat is transferred inward (see arrow F3) from the outside.

In this manner, the molten resin 30 is heated and cured gradually from the position close to the heat source thereof, and a cured resin layer 32 and an uncured resin layer 34 are formed in the housing 20.

In FIG. 9, the die 50 is heated from the lower side to the upper side in the drawing (see arrow F3; a direction in which the heat is conducted by heating), and the resin 30 is cured gradually from the lower side toward the upper side (the ceiling surface side of the housing 20) in the drawing.

Since the volume of the resin 30 is shrunk by thermosetting, the uncured resin layer 34 receives a pulling force (see arrow F2; the adhesion strength by the curing shrinkage) to the direction of the heat source (that is, the cured resin layer 32 side).

As a result, the molten resin filled in the gap flows in an outer circumferential direction and flows to leak out (see arrow F4; the flowing direction of the molten resin).

Since the die 50 includes the heater, the movement of the resin 30 which is shrunk precedingly by the time difference of the curing shrinkage can be transmitted to the necessary position of the housing 20.

By generating the adhesion strength to the semiconductor element 10 of the housing 20, the extra resin 30 can be discharged from the gap between the semiconductor element 10 and the housing 20 into the uncured portion.

The molten resin 30 is heated and cured sequentially toward the inside from the outside of the inner portion of the housing, so that the curing shrinkage force is applied sequentially inward from the outside. For this reason, in the vicinity of the first recess portion 22 positioned in the inner area of the housing 20, the shrinking force is applied inward from the outside (see arrow F2).

As a result, the recess shape of the first recess portion 22 of the housing 20 is curved further.

That is, in the first recess portion 22, the adhesion strength by the curing shrinkage is applied downward (semiconductor element 10 side) to the upper side of the drawing. Accordingly, the first recess portion 22 is stretched downward. Thus, the curvature radius R becomes small, and the degree of curvature of the recess shape becomes more prominent.

When the ceiling surface of the housing 20 is bent such that the distance between the heat dissipation surface 12 of the semiconductor element 10 and the heat conducting member 26 becomes short, the heat dissipation property is improved further compared to a case where the ceiling surface of the housing 20 is in parallel (a case where the ceiling surface does not have a recess shape).

Incidentally, as for the progress of the thermosetting, since the adhesion strength (see arrow F2) by the above-described curing shrinkage is gradually enlarged, the distance between the semiconductor element 10 and the ceiling surface of the housing 20 is shortened.

For this reason, at the time of ending the curing of the resin 30, the first protrusion 24 abuts on the heat dissipation surface 12 of the semiconductor element 10, and the distance therebetween becomes almost zero. In addition, the occurrence of the void is suppressed, and the resin 30 can be cured thinly to some extent not to inhibit the heat dissipation.

According to the above-described manufacturing method, the ceiling surface of the housing 20 can be bent by the curing shrinkage force of the molten resin. Thus, although the housing is used in which the ceiling surface of the housing 20 does not have a recess shape (a linear shape in a sectional view), the ceiling surface can be formed in a recess shape during the thermosetting of the molten resin.

Otherwise, in the step of filling the above-described molten resin, the housing 20 may be used which includes the first recess portion 22 in the position facing the semiconductor element 10 (heat generating member (heat dissipation member)).

As described above, according to the manufacturing method of this embodiment, the housing 20 which includes the first recess portion 22 in advance can be used. In that case, the recess shape of the first recess portion 22 can be curved further by the curing shrinkage force of the molten resin. That is, the curvature radius R can be reduced.

In the step of filling the above-described molten resin, as illustrated in FIGS. 3, 4, and 5, the housing is used which includes the first protrusion 24 protruding in the direction of the semiconductor element 10 (heat generating member (heat dissipation member)). In the step of narrowing the gap by the shrinkage of the resin during the curing, the first protrusion 24 abuts on the surface of the semiconductor element 10 (heat generating member (heat dissipation member)) to prevent the surface adhesion between the first recess portion 22 and the semiconductor element 10.

In the step of filling the above-described molten resin, as illustrated in FIGS. 4 and 5, the housing 20 can be used in which the heat conducting member 26 is provided in the position facing the semiconductor element 10 (heat generating member (heat dissipation member)) in the first recess portion 22.

In the step of filling the above-described molten resin, as illustrated in FIG. 7, the housing 20 can be used which includes the second protrusion 28 for improving the adhesiveness of the resin therein.

In the step of filling the above-described molten resin, as illustrated in FIG. 6, the housing 20 can be used which includes the second recess portion 29 which is provided in the side wall of the housing 20 and is recessed to act in the direction of narrowing the gap.

In the step of narrowing the gap by the shrinkage of the resin during the curing, the second recess portion 29 is recessed by the curing shrinkage force of the resin to narrow the gap.

As described above, the recess shape (second recess portion 29) is provided also in the side wall of the housing 20, so that the width (for example, see W of FIG. 2) in which the ceiling surface connects the bridged second recess portions 29 to each other is shortened compared to the width of the other place.

More force is applied easily due to the recess shape. For this reason, during the curing of the molten resin, much curing shrinkage force is applied by the second recess portion 29, and the second recess portion 29 is curved further.

The manufacturing method according to this embodiment is a simple method, and an additional member for dissipating the heat is not provided necessarily. For this reason, the number of the members can be reduced, and the manufacturing process does not become complicated. Further, an existing manufacturing facility may be used as the semiconductor element 10 or the housing 20.

Accordingly, in the manufacturing method according to this embodiment, the housing can be manufactured by performing casting and plate punching once. Thus, the manufacturing cost can be reduced, and the yield is improved.

The above-described sealing structure and the manufacturing method thereof according to this embodiment can be used in the thermal design technique which relates to various semiconductor devices (such as a transistor, a Peltier element, a silicon device, a power semiconductor device, and various molded semiconductor elements), a capacitor, a resistor, a thermoelectric device, a motor, various heat sources, a heat sink, and the like.

Particularly, the sealing structure and the manufacturing method can be used properly in the technique which is used under the high-temperature environment such as a car electronics field. In addition, the sealing structure and the manufacturing method can be applied also to a semiconductor device such as an alternating electric motor or an alternator.

The sealing structure according to this embodiment can be applied to a power module which represents an inverter using an IGBT (insulated gate bipolar transistor) or the like.

The sealing structure according to this embodiment can be applied to a mobile body representing a railroad vehicle or an automobile. When a fin is provided in the surface of the housing 20 or in the housing 20 and is arranged to contact with an external air, the heat dissipation characteristic can be improved further.

The heat dissipation efficiency is improved by the self-propelling.

The invention can be applied also to a construction machine or an elevator as one kind of another mobile body. In the specification of this application, a device itself which is moved by the unit which operates and self-propels a wheel or the like as described above or the unit which performs driving by using a wire, a motor, or the like is referred to as the mobile body.

The semiconductor device which has a sealing structure according to this embodiment can be applied also to the field of a power generator such as a solar photovoltaic device, a solar power generation module or a wind power generator, and a wind power generation module.

The sealing structure according to this embodiment can be applied also to the field of an industrial machine such as a hoist or an actuator and a compressor.

The sealing structure according to this embodiment can be applied also to the field of a computer such as an uninterruptible power device, a mainframe, and a general-purpose computer. In addition, the sealing structure can be applied also to air conditioning equipment or the like.

According to the air conditioning equipment, an external air is made contact with the power module, the inverter, the cooler such as the fin which is connected thereto, so as to further improve a cooling efficiency.

Also in those examples, the heat dissipation efficiency is excellent, and the reliability of the semiconductor device is improved. A device of the field in which the above-described semiconductor device is collectively used is referred to as an electronics device or a semiconductor device simply.

In the sealing structure according to this embodiment, the heat dissipation efficiency is excellent, and the thermal resistance is excellent. For this reason, for example, it is expected to improve the reliability of the device with respect to the thermal fatigue, to lengthen the lifetime of the member such as a soldering joint part and the entire device, to prevent the excessive increase of the temperature of the surface of the device, and to reduce the number of members with respect to the heat dissipation member or the like.

EMBODIMENT

The invention will be described in detail by using following embodiments and comparative examples. However, the invention is not limited to the following embodiments.

First Reference Example

The sealing structure illustrated in FIG. 10 is manufactured and evaluated. The resin 30 seals the housing 60 in which a length (L) is 100 mm, a width (W) is 80 mm, a height (H) is 14 mm, and a thickness is 1 mm.

By the die 50 including a housing fixing tool and the heater, the entire sealing resin reaches 130° C. at the same time and is heated and cured.

The material of the housing 60 is an aluminum die cast (ADC12), and the housing 60 is configured such that the heat conducting member 62 is arranged in the housing 60, and the heat conducting member 62 is positioned above the semiconductor element 10 (see FIG. 10).

The resin 30 uses an unsaturated polyester (a curing shrinkage ratio in one direction is 300 ppm and a thermal conductivity is 0.9 W/mK). The semiconductor element 10 is used in which a heating value is 10 W, and a specified value of a junction temperature is 150° C.

As a result, the substrate 1 is fixed in the housing 20 such that the gap between the semiconductor element 10 and the housing 20 is 300 μm before the resin-sealing. However, since the resin 30 is cured and shrunk wholly by the heater of the die 50 after the resin-sealing, the distance between the housing 20 and the semiconductor element 10 is not changed to maintain 300 μm.

The obtained sealing structure B is used, and the reliability test is performed under the actual use environment in which an ambient temperature is 105° C., and an ambient wind velocity is 0.5 m/s in a use environment. The junction temperature of the sealing structure reaches 148° C.

First Embodiment

The modification of the sealing structure A3 illustrated in FIGS. 4 and 5 is manufactured and evaluated. The resin seals the housing 20 in which a length (L) is 100 mm, a width (W) is 80 mm, a height (H) is 14 mm, and a thickness is 1 mm. By the die 50 including the housing fixing tool and the heater, the portion apart by 10 mm from the bottom portion reaches 130° C. first and is cured, and the sealing structure is manufactured.

The material of the housing 20 is the aluminum die cast (ADC12), and the unsaturated polyester (the curing shrinkage ratio in one direction is 300 ppm, and the thermal conductivity is 0.9 W/mK) is used as the resin 30. The semiconductor element 10 is used in which a heating value is 10 W, and a specified value of a junction temperature is 150° C.

The four first protrusions 24 of 200 μm are provided in the inside of the housing 20 which approaches the insulation portion 14 of the upper side of the surface of the semiconductor element 10. It is prevented that the heat dissipation surface 12 of the upper side of the surface of the semiconductor element 10 directly contacts with the inside of the housing 20.

In the central portion of the upper surface of the housing 20 in the longitudinal direction, a structure is formed such that the square-shaped portion having a longitudinal length of 10 mm and a width of 10 mm is present to be entered into the housing by 5 mm, and both sides thereof are connected to be bridged by the first recess portion 22 which is connected with the two surfaces having a width of 10 mm through the curved portion having the curvature radius of 10 mm.

The substrate 1 is fixed in the housing 20 such that the gap between the semiconductor element 10 and the housing 20 is 400 μm before the resin-sealing.

The curing shrinkage is performed by the heater of the die 50 after the resin-sealing. As a result, it is not checked whether the insulation portion 14 of the upper side of the surface of the semiconductor element 10 contacts with the four first protrusions 24 in the housing 20.

However, it is checked at least that the housing 20 approaches the semiconductor element 10 at 150 μm, and a distance between the housing 20 and the semiconductor element 10 becomes 250 μm. Incidentally, it is not checked whether a void is present in the gap between the semiconductor element 10 and the housing 20.

The obtained sealing structure is used, and the reliability test is performed under the actual use environment in which the ambient temperature is 105° C., and the ambient wind velocity is 0.5 m/s in the use environment. The junction temperature of the sealing structure is suppressed to be 147° C.

Incidentally, in the actual field test of the product which is performed additionally, the junction temperature of the sealing structure B of the first reference example is 148° C. It is known that the soldering connection lifetime can be improved by 10% when a temperature is decreased by 1° C.

Further, it is checked at least that the void of the gap between the semiconductor element 10 and the housing 20 is suppressed to contribute the margin securement of the junction temperature.

Second Embodiment

The modification of the sealing structure A3 illustrated in FIGS. 4 and 5 is manufactured and evaluated.

The resin 30 seals the housing 20 in which the length (L) is 100 mm, the width (W) is 80 mm, the height (H) is 14 mm, and the thickness is 1 mm. By the die 50 including the housing fixing tool and the heater, the portion apart by 10 mm from the bottom portion reaches 130° C. first and is cured, and the sealing structure is manufactured.

The material of the housing 20 is an aluminum die cast (ADC12), and an unsaturated polyester (the curing shrinkage ratio is 300 ppm in one direction, and the thermal conductivity is 0.9 W/mK) is used as the resin 30. The semiconductor element 10 is used in which the heating value is 10 W, and the specified value of the junction temperature is 150° C.

The four first protrusions 24 of 200 μm are provided in the inside of the housing 20 which approaches the insulation portion 14 of the upper side of the surface of the semiconductor element 10. It is prevented that the heat dissipation surface 12 of the upper side of the surface of the semiconductor element 10 directly contacts with the inside of the housing 20.

In the central portion of the upper surface of the housing 20 in the longitudinal direction, a structure is formed such that the square-shaped portion having the longitudinal length of 10 mm and the width of 10 mm is present to be entered into the housing 20 by 5 mm, and both sides thereof are connected to be bridged by a V-shaped structure (first recess portion 22) which is connected with the two surfaces having the width of 10 mm.

As a result, a circuit substrate is fixed in the housing such that the gap between the semiconductor element 10 and the housing 20 is 400 μm before the resin-sealing.

After the resin-sealing, the curing shrinkage is performed by the heater of the die 50, and it is not checked whether the insulation portion 14 of the upper side of the surface of the semiconductor element 10 contacts with the four first protrusions 24 in the housing 20.

However, it is checked at least that the housing 20 approaches the semiconductor element 10 at 180 μm, and the distance between the housing 20 and the semiconductor element 10 becomes 220 μm. Incidentally, it is not checked whether a void is present in the gap between the semiconductor element 10 and the housing 20.

The obtained sealing structure is used, and the reliability test is performed under the actual use environment in which the ambient temperature is 105° C., and the ambient wind velocity is 0.5 m/s in the use environment. The junction temperature of the sealing structure is suppressed to be 146.5° C.

Incidentally, in the actual field test of the product which is performed additionally, the junction temperature of the sealing structure B of the first reference example is 148° C. Meanwhile, it is known that the soldering connection lifetime can be improved by approximately 15% when a temperature is decreased by 1.5° C.

Further, it is checked at least that the void of the gap between the semiconductor element 10 and the housing 20 is suppressed to contribute the margin securement of the junction temperature.

Third Embodiment

The modification of the sealing structure A4 illustrated in FIG. 6 is manufactured and evaluated.

The resin 30 seals the housing 20 in which the length (L) is 100 mm, the width (W) is 80 mm, the height (H) is 14 mm, and the thickness is 1 mm. By the die 50 including the housing fixing tool and the heater, the portion apart by 10 mm from the bottom portion reaches 130° C. first and is cured, and the sealing structure is manufactured.

The material of the housing 20 is an aluminum die cast (ADC12), and the sealing resin is an unsaturated polyester in which the curing shrinkage ratio is 300 ppm in one direction, and the thermal conductivity is 0.9 W/mK. The semiconductor element 10 is used in which the heating value is 10 W, and the specified value of the junction temperature is 150° C.

The four first protrusions 24 of 200 μm are provided in the inside of the housing 20 which approaches the insulation portion 14 of the upper surface of the semiconductor element 10. It is prevented that the upper surface of the semiconductor element 10 directly contacts with the inside of the housing 20.

In the central portions of two longitudinal side walls of the housing 20, two V-shaped structures (second recess portion 29) are provided in which the rectangular portion having a longitudinal length of 10 mm and a height of 14 mm is entered into the housing by 5 mm, and one V-shaped structure (first recess portion 22) which is entered into the housing 20 by 2 mm is bridged to be connected with the upper surface of the housing 20.

As a result, the circuit substrate 1 is fixed in the housing 20 such that the gap between the semiconductor element 10 and the housing 20 is 400 μm before the resin-sealing. However, after the resin-sealing, the curing shrinkage is performed by the heater of the die 50, and it is checked at least that the insulation portion 14 of the upper surface of the semiconductor element 10 contacts with the four first protrusions 24 in the housing 20, and the housing 20 can approaches the semiconductor element 10 at 200 μm.

Incidentally, it is not checked whether a void is present in the gap between the semiconductor and the housing.

The obtained sealing structure is used, and the reliability test is performed under the actual use environment in which the ambient temperature is 105° C., and the ambient wind velocity is 0.5 m/s in the use environment. The junction temperature of the sealing structure is suppressed to be 146° C.

Incidentally, in the actual field test of the product which is performed additionally, the junction temperature of the sealing structure B of the first reference example is 148° C. Meanwhile, it is known that the soldering connection lifetime can be improved by approximately 20% when a temperature is decreased by 2° C.

Further, it is checked at least that the void of the gap between the semiconductor element 10 and the housing 20 is suppressed to contribute the margin securement of the junction temperature.

REFERENCE SIGNS LIST

A1, A2, A3, A4, A5, B: sealing structure
1: substrate
10: semiconductor element
12: heat dissipation surface of semiconductor element
14: insulation portion of semiconductor element
20, 60: housing
22: first recess portion of housing
24: first protrusion of housing
26, 62: heat conducting member
28: second protrusion of housing
29: second recess portion of housing
30: resin
32: cured resin layer
34: uncured resin layer
50: die
50a: upper die
50b: lower die
52: gate
F1, F4: flowing direction of molten resin
F2: adhesion strength by curing shrinkage
F3: direction in which heat is conducted by heating
R: curvature radius
H: height
L: length
W: width
D: gap

The invention claimed is:
1. A manufacturing method of a sealing structure which includes a housing which houses a heat generating member or a heat dissipation member thereinside, and a resin which seals an inner portion of the housing, the method comprising steps of:
　filling the housing with the resin which is shrunk during curing in the housing;
　gradually curing a first portion of the resin which is filled in a circumferential edge area of the inner portion of the housing prior to a second portion of the resin which is filled in an area near a gap between the heat generating member or the heat dissipation member and the housing; and narrowing the gap by shrinkage of the resin during the curing.

2. The manufacturing method of the sealing structure according to claim 1, wherein in the step of filling the resin, the housing is used which includes a first recess portion in a position facing the heat generating member or the heat dissipation member.

3. The manufacturing method of the sealing structure according to claim 1, wherein in the step of filling the resin, the housing is used which includes a protrusion protruding in a direction of the heat generating member or the heat dissipation member, and in the step of narrowing the gap by the shrinkage of the resin during the curing, the protrusion abuts on the heat generating member or the heat dissipation member.

4. The manufacturing method of the sealing structure according to claim 2, wherein in the step of filling the resin, the housing is used in which a heat conducting member is provided in a position facing the heat generating member or the heat dissipation member inside the first recess portion.

5. The manufacturing method of the sealing structure according to claim 2, wherein in the step of filling the resin, the housing is used which includes a second protrusion protruding inward in a position different from the first recess portion.

6. The manufacturing method of the sealing structure according to claim 1, wherein in the step of filling the resin, the housing is used which includes a second recess portion which is provided in a side wall of the housing and is recessed to act in a direction of narrowing the gap, and in the step of narrowing the gap by the shrinkage of the resin during the curing, the second recess portion is recessed by the shrinkage of the resin during the curing to narrow the gap.

* * * * *